United States Patent
Hoshi

(10) Patent No.: US 11,404,408 B2
(45) Date of Patent: Aug. 2, 2022

(54) SEMICONDUCTOR DEVICE HAVING TEMPERATURE SENSING PORTIONS AND METHOD OF MANUFACTURING THE SAME

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 132 days.

(21) Appl. No.: 16/888,748

(22) Filed: May 31, 2020

(65) Prior Publication Data

US 2021/0013196 A1 Jan. 14, 2021

(30) Foreign Application Priority Data

Jul. 11, 2019 (JP) .............................. JP2019-129514

(51) Int. Cl.
*H01L 27/02* (2006.01)
*H01L 27/06* (2006.01)
(Continued)

(52) U.S. Cl.
CPC ...... *H01L 27/0255* (2013.01); *H01L 21/8213* (2013.01); *H01L 23/34* (2013.01);
(Continued)

(58) Field of Classification Search
CPC ............ H01L 29/7813; H01L 29/7825; H01L 29/66613–66628; H01L 29/42336; H01L 29/42352; H01L 29/4236; H01L 27/2454; H01L 29/7827; H01L 21/823487; H01L 21/823885; H01L 29/66712–66734; H01L 29/7802–7815; H01L 29/66106;
(Continued)

(56) References Cited

U.S. PATENT DOCUMENTS 10,468,402 B1 * 11/2019 Park .................. H01L 29/66727
10,991,821 B2 * 4/2021 Hoshi ................. H01L 29/1095
(Continued)

FOREIGN PATENT DOCUMENTS

JP H10294475 A 11/1998
JP 2018098476 A 6/2018

*Primary Examiner* — Scott B Geyer
(74) *Attorney, Agent, or Firm* — Rabin & Berdo, P.C.

(57) ABSTRACT

A semiconductor device includes a MOS structure part and first to third temperature sensing portions. The MOS structure part has a semiconductor substrate of a first conductivity type, a first semiconductor layer of the first conductivity type, a second semiconductor layer of a second conductivity type, first semiconductor regions of the first conductivity type, trenches, and gate electrodes provided in the trenches via a gate insulating film. The first to the third temperature sensing portions are provided in plural and each includes the semiconductor substrate, the first semiconductor layer, a temperature sensing trench, a first polysilicon layer of the first conductivity type and a second polysilicon layer of the second conductivity type provided in the temperature sensing trench via an insulating film, a cathode electrode connected to the first polysilicon layer, and an anode electrode connected to the second polysilicon layer.

5 Claims, 11 Drawing Sheets

(51) Int. Cl.
  *H01L 21/82*   (2006.01)
  *H01L 23/34*   (2006.01)
  *H01L 29/78*   (2006.01)
  *H01L 29/66*   (2006.01)

(52) U.S. Cl.
  CPC .... *H01L 27/0629* (2013.01); *H01L 29/66734* (2013.01); *H01L 29/7804* (2013.01); *H01L 29/7813* (2013.01)

(58) Field of Classification Search
  CPC ............. H01L 29/7808; H01L 29/7821; H01L 29/866; H01L 2924/12035; H01L 27/0255
  See application file for complete search history.

(56) References Cited

U.S. PATENT DOCUMENTS

| | | |
|---|---|---|
| 2013/0075810 A1* | 3/2013 | Hsieh ................ H01L 29/66734 257/328 |
| 2017/0256536 A1 | 9/2017 | Nishida et al. |
| 2018/0277437 A1* | 9/2018 | Yamada ................ H01L 29/06 |
| 2020/0058735 A1* | 2/2020 | Naito ................ H01L 29/8613 |
| 2020/0144149 A1* | 5/2020 | Kubouchi ............... H01L 29/32 |
| 2020/0258991 A1* | 8/2020 | Hoshi ................ H01L 29/7813 |
| 2020/0373292 A1* | 11/2020 | Hoshi ................ H01L 29/1608 |

\* cited by examiner

SEMICONDUCTOR DEVICE HAVING TEMPERATURE SENSING PORTIONS AND METHOD OF MANUFACTURING THE SAME

CROSS REFERENCE TO RELATED APPLICATIONS

This application is based upon and claims the benefit of priority of the prior Japanese Patent Application No. 2019-129514, filed on Jul. 11, 2019, the entire contents of which are incorporated herein by reference.

BACKGROUND OF THE INVENTION

1. Field of the Invention

Embodiments of the invention relate to semiconductor device and method of manufacturing a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials that have a bandgap wider than that of silicon such as gallium nitride (GaN). Therefore, use of a wide bandgap semiconductor material enables the breakdown voltage of semiconductor devices to be increased.

FIG. 13 is a top view of a structure of a conventional silicon carbide semiconductor device. As depicted in FIG. 13, a semiconductor chip 160 includes at an outer periphery of an active region 140 through which main current passes, an edge termination region 141 that surrounds a periphery of the active region 140 and sustains a breakdown voltage. A gate electrode pad 122 electrically connected to gate electrodes and a source electrode pad 115 electrically connected to source electrodes are provided in the active region 140.

To further enhance the reliability of a silicon carbide semiconductor device, a semiconductor device has been proposed in which high-function regions 103a such as a current sensing portion 137a, a temperature sensing portion 135a, and an overcurrent protecting portion (not depicted) are disposed on a single semiconductor substrate having a vertical MOSFET that is a main semiconductor element. In this case, to stabilize and form the high-function regions 103a, a region in which only the high-function regions 103a are disposed is provided in the active region 140, separate from unit cells of the main semiconductor element and adjacent to the edge termination region 141. The active region 140 is a region through which the main current passes when the main semiconductor element is ON. The edge termination region 141 is a region for mitigating electric field at a front side of the semiconductor substrate and for sustaining the breakdown voltage (withstand voltage). The breakdown voltage is a voltage limit at which no errant operation or destruction of an element occurs.

In the current sensing portion 137a, an active region thereof having a same structure as that of the active region 140 and external terminal electrodes for current detection are provided. The current detection obtains a current value by detecting an electric potential difference between external resistors connected between an OC pad 137 that is an electrode pad of the current sensing portion 137a and source electrodes of the active region 140.

The temperature sensing portion 135a has a function of detecting a temperature of the semiconductor chip 160 by using diode temperature characteristics. The temperature sensing portion 135a is disposed at a center of the semiconductor chip 160 and is connected to an anode electrode pad 135 and a cathode electrode pad 136.

FIG. 14 is a cross-sectional view of the structure of a portion of the conventional silicon carbide semiconductor device at cutting line A-A' in FIG. 13. A trench-type MOSFET 150 is depicted as the conventional silicon carbide semiconductor device. In the trench-type MOSFET 150, an n-type silicon carbide epitaxial layer 102 is deposited at a front surface of an n$^+$-type silicon carbide substrate 101. At a side of the n-type silicon carbide epitaxial layer 102, opposite a side of the n-type silicon carbide epitaxial layer 102 facing the n$^+$-type silicon carbide substrate 101, an n-type high-concentration region 106 is provided. Further, in the n-type high-concentration region 106, second p$^+$-type base regions 105 are selectively provided so that each covers an entire area of a bottom of a trench 118. In a surface layer of a side of the n-type high-concentration region 106, opposite a side of the n-type high-concentration region 106 facing the n$^+$-type silicon carbide substrate 101, a first p$^+$-type base region 104 is selectively provided.

Further, in the conventional trench-type MOSFET 150, a p-type base layer 103, n$^+$-type source regions 107, p$^{++}$-type contact regions 108, a gate insulating film 109, gate electrodes 110, an interlayer insulating film 111, source electrodes 113, a back electrode 114, the source electrode pad 115, and a drain electrode pad (not depicted) are further provided.

The source electrode pad 115, for example, is configured by stacking a first TiN film 125, a first Ti film 126, a second TiN film 127, a second Ti film 128, and an Al alloy film 129. Further, a plating film 116, a solder 117, an external terminal electrode 119, a first protective film 121, and a second protective film 123 are provided at a top of the source electrode pad 115.

Further, in the temperature sensing portion 135a, the insulating film 112 is provided on a surface of a p$^{++}$-type contact region 108 and a diode configured by a p-type polysilicon layer 181 and an n-type polysilicon layer 182 respectively formed by polysilicon (poly-Si) layers on a surface of an insulating film 112 is provided. The p-type polysilicon layer 181 and the n-type polysilicon layer 182 are connected to an anode electrode 184 and a cathode electrode 185, respectively. The anode electrode 184 and the cathode electrode 185 are insulated from one another by the interlayer insulating film 111 and are connected to the anode electrode pad 135 and the cathode electrode pad 136.

A commonly known semiconductor device enables suppression of undesirable current increases and has a structure in which a bidirectional Zener diode is formed in a trench, the bidirectional Zener diode being formed on a bottom-wall insulating film in a diode trench; and the bidirectional Zener diode having at least one p-type portion formed between a pair of n$^+$-type portions and a pair of n$^+$-type portions (for example, refer to Japanese Laid-Open Patent Publication No. 2018-098476).

SUMMARY OF THE INVENTION

According to an embodiment of the present invention, a semiconductor device includes a MOS structure part that includes a semiconductor substrate of a first conductivity type, having a front surface and a back surface opposite to the front surface, a first semiconductor layer of the first conductivity type, provided at the front surface of the semiconductor substrate and having an impurity concentration that is lower than an impurity concentration of the semiconductor substrate, the first semiconductor layer having a first side and a second side that is opposite to the first side and faces the semiconductor substrate, a second semiconductor layer of a second conductivity type, provided at the first side of the first semiconductor layer and having a first side and a second side that is opposite to the first side and faces the semiconductor substrate, a plurality of first semiconductor regions of the first conductivity type, selectively provided in a surface layer of the first side of the second semiconductor layer, a plurality of first trenches each penetrating a corresponding one of the plurality of first semiconductor regions and the second semiconductor layer, and reaching the first semiconductor layer, a plurality of gate electrodes each provided in a corresponding one of the plurality of first trenches, via a gate insulating film, an interlayer insulating film provided on the plurality of gate electrodes, a plurality of first electrodes each provided at the first side of the second semiconductor layer and the first side of a corresponding one of the plurality of first semiconductor regions, and a second electrode provided at the back surface of the semiconductor substrate; and a plurality of temperature sensing portions, each of which is provided in a region through which a main current flows in an ON state of the semiconductor device, and each of the plurality of temperature sensing portions includes: the semiconductor substrate, the first semiconductor layer, a second trench provided in the semiconductor substrate, a first polysilicon layer of the first conductivity type and a second polysilicon layer of the second conductivity type, provided in the second trench via an insulating film, a cathode electrode electrically connected to the first polysilicon layer, and an anode electrode electrically connected to the second polysilicon layer.

In the embodiment, the plurality of first trenches of the MOS structure part each extend so that the plurality of first trenches form a striped pattern, and each of the plurality of temperature sensing portions is provided so as to discontinue a corresponding one of the plurality of first trenches in its extending direction.

In the embodiment, the MOS structure part includes: a plurality of second semiconductor regions of the second conductivity type, each of the plurality of second semiconductor regions being provided between and in contact with the first semiconductor layer and the second semiconductor layer, between two adjacent first trenches among the plurality of first trenches, the plurality of second semiconductor regions having an impurity concentration that is higher than an impurity concentration of the second semiconductor layer, a plurality of third semiconductor regions of the second conductivity type, each of the plurality of third semiconductor regions being provided in the first semiconductor layer, at a position facing a corresponding one of the plurality of first trenches in a depth direction, and a plurality of connecting regions connecting the plurality of second semiconductor regions with the plurality of third semiconductor regions. The plurality of temperature sensing portions include one or more of first temperature sensing portions and one or more of second temperature sensing portions, and one or more of the plurality of connecting regions has a corresponding one of the one or more of the second temperature sensing portions.

In the embodiment, the plurality of temperature sensing portions has a cathode electrode pad electrically connected to the cathode electrode of each of the plurality of temperature sensing portions, and the anode electrode of each of the plurality of temperature sensing portions is connected to a corresponding one of the plurality of first electrodes.

In the embodiment, the plurality of temperature sensing portions has: a cathode electrode pad electrically connected to the cathode electrode of each of the plurality of temperature sensing portions, and an anode electrode pad electrically connected to the anode electrode of each of the plurality of temperature sensing portions.

According to another embodiment of the invention, a method of manufacturing a semiconductor device having a MOS structure part and a temperature sensing portion, includes: forming a first semiconductor layer of a first conductivity type at a front surface of a semiconductor substrate of the first conductivity type, the first semiconductor layer having a first side and a second side that is opposite to the first side and faces the semiconductor substrate, the first semiconductor layer having an impurity concentration that is lower than an impurity concentration of the semiconductor substrate; forming a second semiconductor layer of a second conductivity type at the first side of the first semiconductor layer, the second semiconductor layer having a first side and a second side that is opposite to the first side of the second semiconductor layer and faces the semiconductor substrate; selectively forming a plurality of first semiconductor regions of the first conductivity type, in a surface layer of the first side of the second semiconductor layer; forming a plurality of first trenches each extending so that the plurality of first trenches form a striped pattern, and a plurality of second trenches, each of the plurality of first trenches penetrating a corresponding one of the plurality of first semiconductor regions and the second semiconductor layer, and reaching the first semiconductor layer; forming a plurality of gate electrodes, each of the plurality of gate electrodes being formed in a corresponding one of the plurality of first trenches via a gate insulating film; forming a plurality of first polysilicon layers of the first conductivity type and a plurality of second polysilicon layers of the second conductivity type, each of the plurality of first polysilicon layers and each of the plurality of second polysilicon layers being formed in a corresponding one of the plurality of second trenches via an insulating film; forming an interlayer insulating film on the plurality of gate electrodes; forming a plurality of first electrodes, each of the plurality of first electrodes being formed at the first side of the second semiconductor layer and the first side of a corresponding one of the plurality of first semiconductor regions; forming a second electrode at a back surface of the semiconductor substrate; forming a plurality of cathode electrodes, each of the plurality of cathode electrodes being electrically connected to a corresponding one of the plurality of first polysilicon layers; and forming a plurality of anode electrodes, each of the plurality of anode electrodes being electrically connected to a corresponding one of the plurality of second polysilicon layers. The each of the plurality of first polysilicon layers and the each of the plurality of second polysilicon layers are formed to discontinue a corresponding one of the plurality of first trenches in its extending direction.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
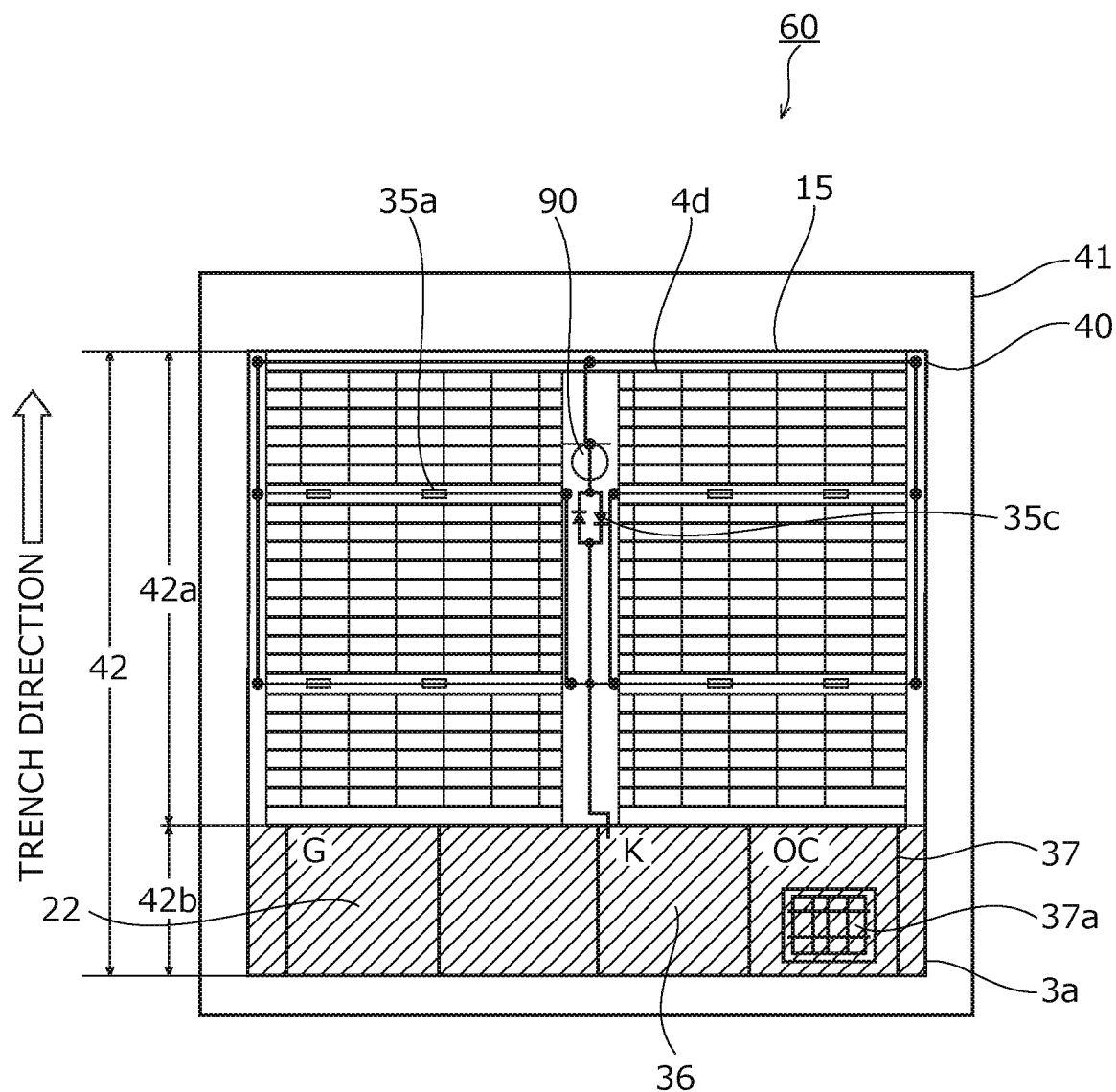
FIG. 1 is a top view of a structure of a silicon carbide semiconductor device according to a first embodiment.

In the vertical MOSFET 150 of the conventional structure, the temperature sensing portion 135a is disposed at only one location at the center. The silicon carbide semiconductor device is used at high frequencies and with large currents and therefore, instantaneous temperature rise is fast and the temperature rise of the element is not uniform, whereby non-uniform temperature distribution occurs in the element. Therefore, when the temperature sensing portion 135a is provided at only one location, the temperature at a location where the temperature has risen cannot be measured and the silicon carbide semiconductor device may be destroyed.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to the present invention is configured using a wide bandgap semiconductor material. In the embodiments, a silicon carbide semiconductor device fabricated using, for example, silicon carbide (SiC) as a wide bandgap semiconductor material will be described taking a MOSFET as an example.

Figure 2:
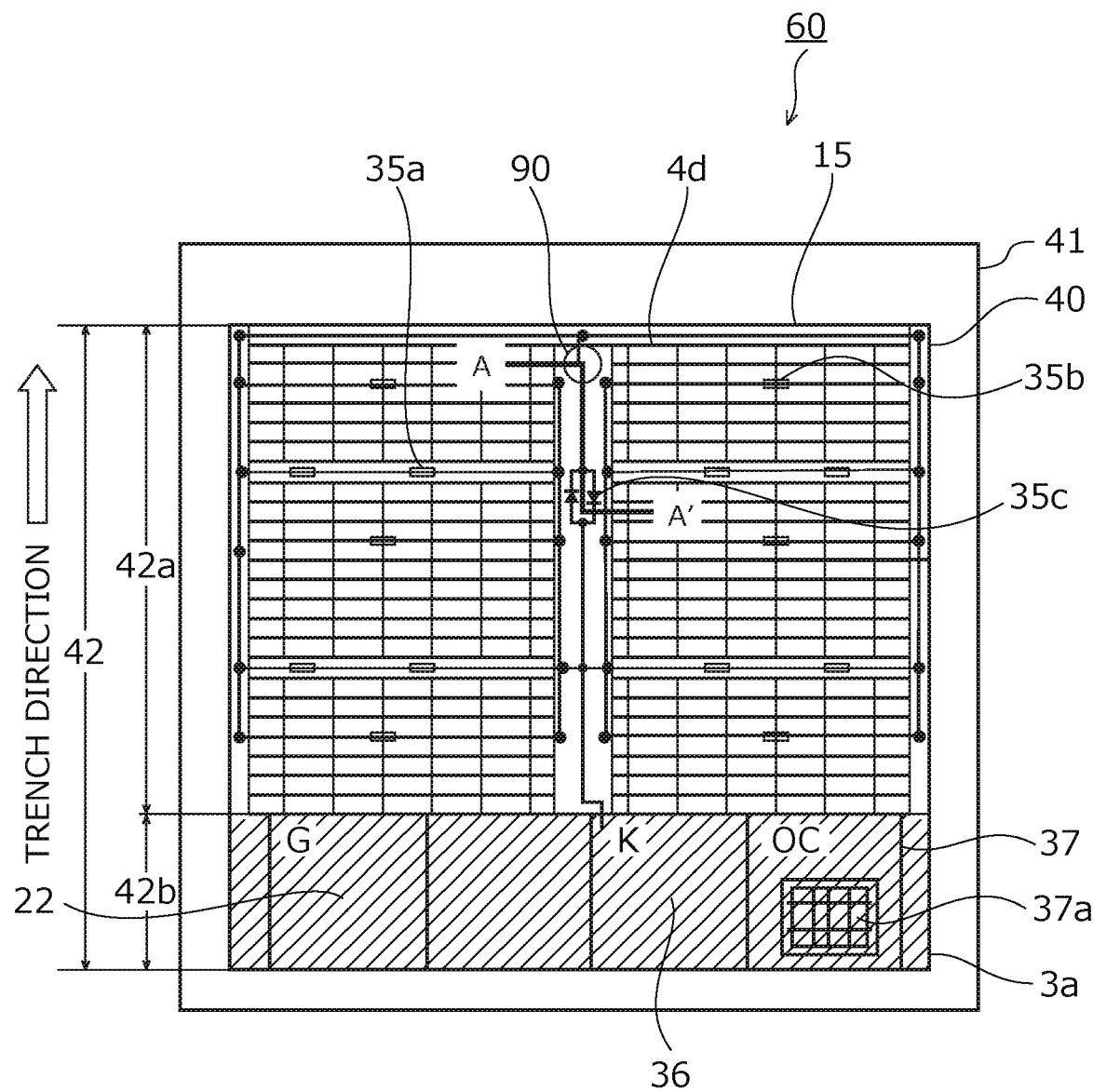
FIG. 2 is a top view of another structure of the silicon carbide semiconductor device according to the first embodiment.

FIG. 1 is a top view of a structure of the silicon carbide semiconductor device according to the first embodiment. FIG. 2 is a top view of another structure of the silicon carbide semiconductor device according to the first embodiment. As depicted in FIGS. 1 and 2, a semiconductor chip 60 includes, at an outer periphery of an active region 40 through which a main current passes, an edge termination region 41 that surrounds a periphery of the active region 40 and sustains a breakdown voltage.

The semiconductor chip 60 according to the first embodiment and depicted in FIGS. 1 and 2 has a main semiconductor element 42 provided in the active region 40 of a semiconductor substrate (semiconductor chip). The main semiconductor element 42 is a vertical MOSFET 50 through which a drift current flows in a depth direction of the semiconductor substrate in an ON state. The main semiconductor element 42 is configured by plural unit cells (functional units of an element) connected in parallel to one another by a source electrode pad 15.

The unit cells of the main semiconductor element 42 are disposed adjacent to one another in a direction parallel to a front surface of the semiconductor chip 60. The main semiconductor element 42 performs a main operation of the vertical MOSFET 50 according to the first embodiment. The main semiconductor element 42 is disposed in an effective region (main effective region) of the active region 40. A main effective region 42a is a region through which a main current of the main semiconductor element 42 passes when the main semiconductor element 42 is ON. The main effective region 42a, for example, has a substantially rectangular planar shape and occupies a majority of a surface area of the active region 40.

Circuit portions for protecting/controlling the main semiconductor element 42, for example, are high-function portions such as a current sensing portion 37a, first and third temperature sensing portions 35a, 35c, an overcurrent protecting portion (not depicted), and an arithmetic circuit portion (not depicted); high-function portions other than the first and the third temperature sensing portions 35a, 35c are disposed in a main non-operating region 42b (high-function regions 3a) of the active region 40. The first and the third temperature sensing portions 35a, 35c are disposed in the main effective region 42a. The main non-operating region 42b is a region in which none of the unit cells of the main semiconductor element 42 are disposed and that does not function as the main semiconductor element 42. The main non-operating region 42b, for example, has a substantially rectangular planar shape and is disposed between the main effective region 42a and the edge termination region 41. In FIG. 1, a region having diagonal lines is the main non-operating region 42b (similarly in FIGS. 2, 10, and 11).

The edge termination region 41 is a region between the active region 40 and an end of the semiconductor chip 60; the edge termination region 41 surrounds a periphery of the active region 40, mitigates electric field at a front side of the semiconductor chip 60, and sustains breakdown voltage. In the edge termination region 41, for example, a voltage withstanding structure (not depicted) such as field limiting ring (FLR) or a junction termination extension (JTE) structure is disposed. The breakdown voltage is a voltage limit at which no errant operation or destruction of an element occurs.

The source electrode pad 15 of the main semiconductor element 42 is disposed on the front surface of the semiconductor chip 60, in the main effective region 42a. The main semiconductor element 42 has a large current capacity as compared to other circuit portions. Therefore, the source electrode pad 15 of the main semiconductor element 42 has a planar shape that is substantially a same as that of the main effective region 42a and covers substantially an entire area of a surface of the main effective region 42a. The source electrode pad 15 of the main semiconductor element 42 is disposed to be separate from other electrode pads excluding the source electrode pad 15.

The other electrode pads excluding the source electrode pad 15 are separate from the edge termination region 41 and in the main non-operating region 42b, are disposed on the front surface of the semiconductor chip 60, separate from one another. The other electrode pads excluding the source electrode pad 15 include a gate electrode pad 22 of the main semiconductor element 42, an electrode pad (hereinafter, OC pad) 37 of the current sensing portion 37a, an electrode pad (hereinafter, cathode electrode pad) 36 of the first and the third temperature sensing portions 35a, 35c, an electrode pad (hereinafter, OV pad, not depicted) of the overcurrent protecting portion, and an electrode pad (not depicted) of the arithmetic circuit portion.

The other electrode pads excluding the source electrode pad 15, for example, have a substantially rectangular planar shape and have a surface area necessary for bonding external terminal electrodes 19 described hereinafter and/or wires.

Figure 10:
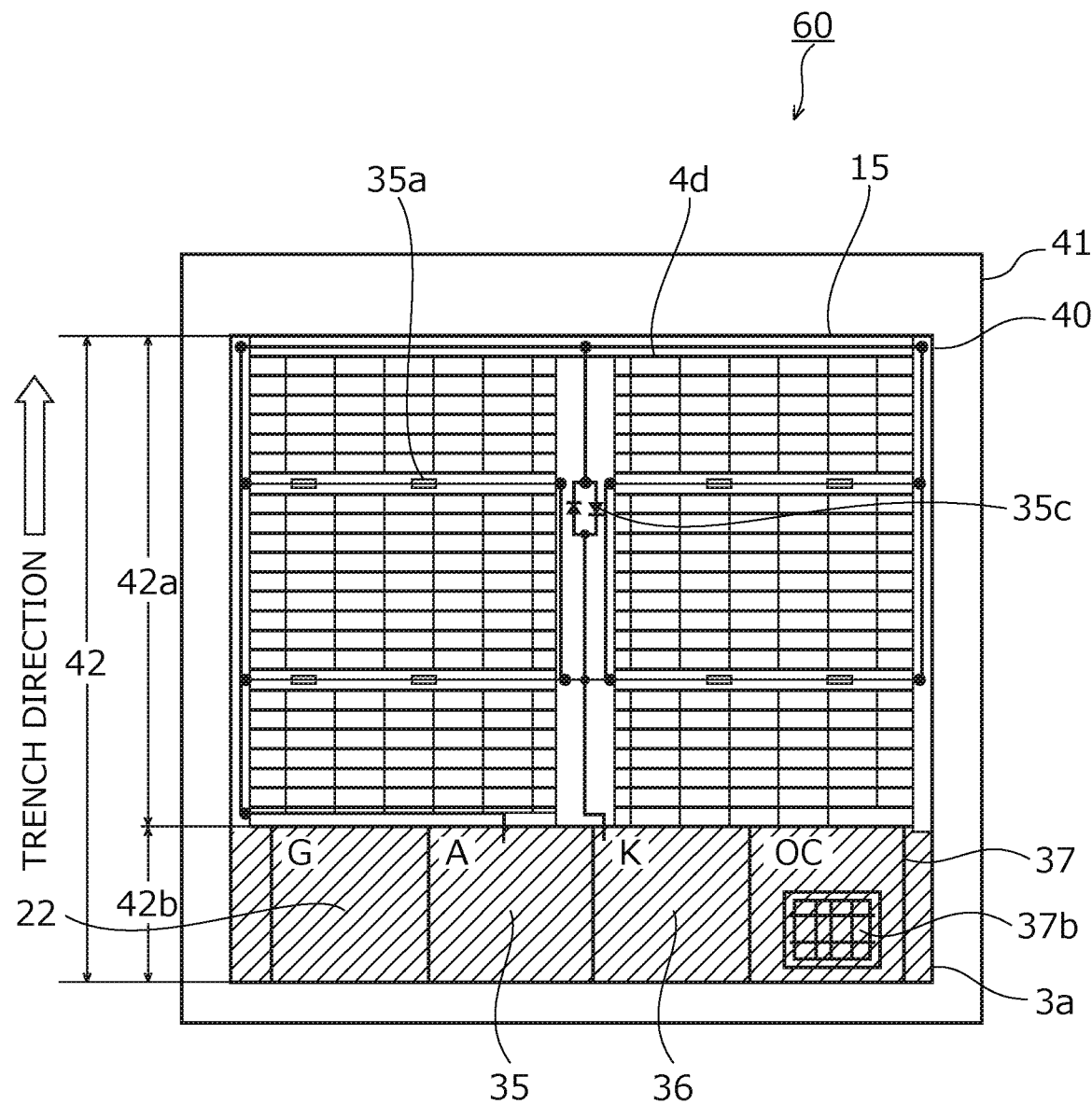
FIG. 10 is a top view depicting a structure of a silicon carbide semiconductor device according to a second embodiment.
Figure 11:
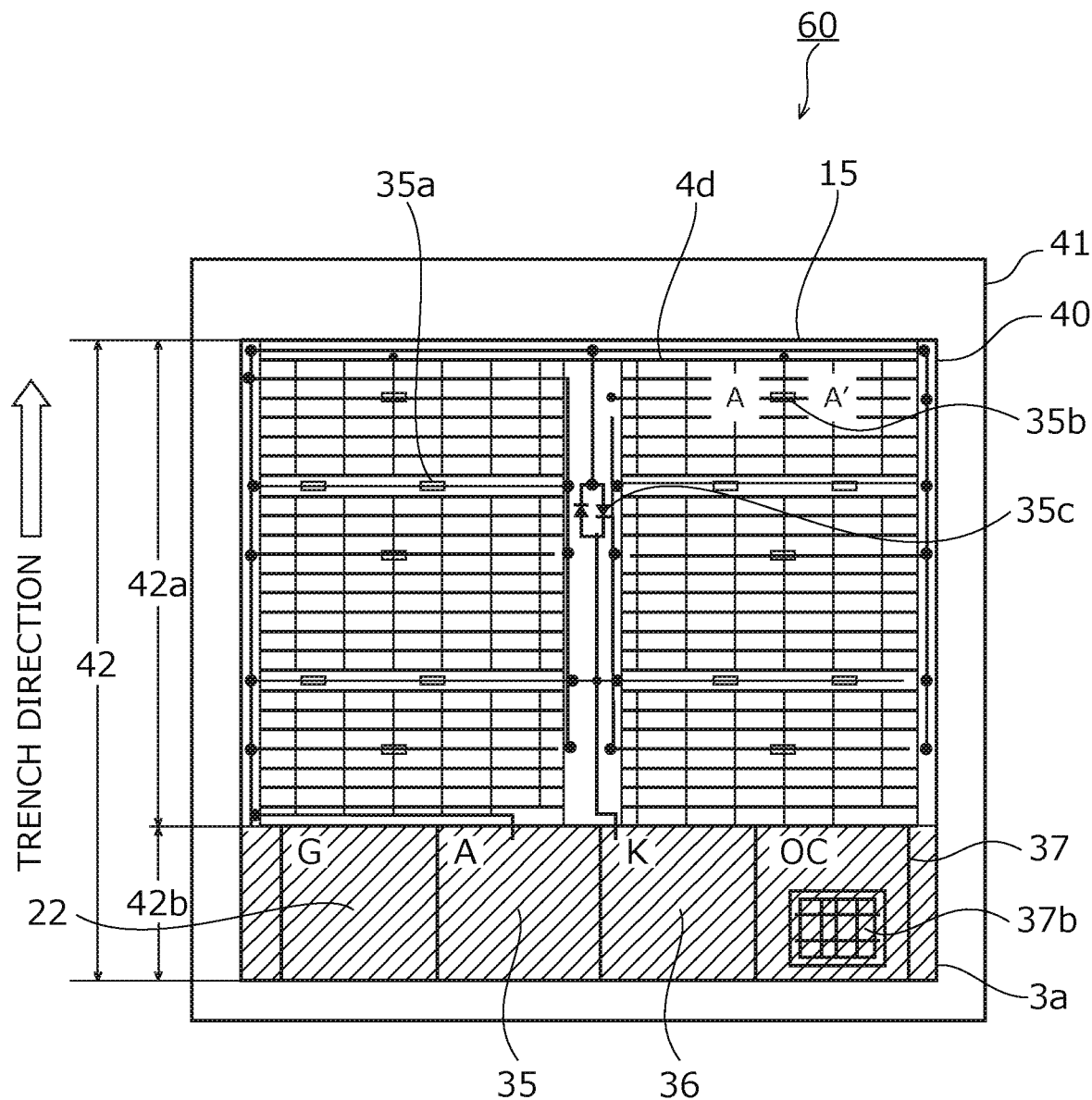
FIG. 11 is a top view depicting another structure of the silicon carbide semiconductor device according to the second embodiment.

FIG. 1 depicts a case in which the other electrode pads excluding the source electrode pad 15 are disposed in a row along a border between the main non-operating region 42b and the edge termination region 41 (similarly in FIGS. 2, 10, and 11). Further, in FIG. 1, the gate electrode pad 22, an OC pad 37, and a cathode electrode pad 36 are depicted in rectangular shape appended with "G", "OC", and "K", respectively (similarly in FIGS. 2, 10, and 11).

The current sensing portion 37a operates under conditions similar to those of the vertical MOSFET 50 of the main semiconductor element 42 and has a function of detecting overcurrent (OC) flowing in the vertical MOSFET 50 of the main semiconductor element 42. The current sensing portion 37a is disposed to be separate from the vertical MOSFET 50 of the main semiconductor element 42. The current sensing portion 37a is a vertical MOSFET that includes unit cells having a configuration similar to those of the main semiconductor element 42, of a quantity (total number) (for example, about 10) lower than a quantity (total number) (for example, about 10,000) of the unit cells of the main semiconductor element 42.

The unit cells of the current sensing portion 37a are disposed in a region (hereinafter, sensing effective region) of a portion directly beneath the OC pad 37. The sensing effective region, for example, has a substantially rectangular planar shape. The unit cells of the current sensing portion 37a are disposed adjacent to one another in a direction parallel to the front surface of the semiconductor chip 60. The direction in which the unit cells of the current sensing portion 37a are adjacent to one another, for example, is a same direction in which the unit cells of the main semiconductor element 42 are adjacent to one another. The unit cells of the current sensing portion 37a are connected in parallel to one another by the OC pad 37.

The first and the third temperature sensing portions 35a, 35c have a function of detecting a temperature of the main semiconductor element 42 by using diode temperature characteristics. For example, a diode that is formed by a p-type polysilicon layer (second polysilicon layer) 81 and an n-type polysilicon layer (first polysilicon layer) 82 described hereinafter is provided in the first and the third temperature sensing portions 35a, 35c (refer to FIG. 3). A forward voltage Vf of the diode varies according to temperature and as the temperature increases, the forward voltage Vf increases. Therefore, a relationship between temperature and the forward voltage Vf is obtained in advance and the forward voltage Vf of the diode is measured during operation of the MOSFET 50, whereby the temperature of the MOSFET 50 may be measured.

In the first embodiment, as depicted in FIGS. 1 and 2, similar to the conventional structure, while the third temperature sensing portion 35c is also provided at a center of the semiconductor chip 60, the first the temperature sensing portion 35a is further provided in plural in the main effective region 42a. For example, the first temperature sensing portions 35a are provided so as to interrupt trenches (first trenches) 18 in a direction in which the trenches 18 of a MOS structure part described hereinafter extend in a striped pattern. In other words, the first temperature sensing portions 35a are each provided so as to discontinue a corresponding one of the trenches 18 in its extending direction. At regions of portions of the trenches 18 of the MOS structure part, instead of a gate insulating film and a gate electrode, an insulating film and the diode are embedded, thereby forming the first temperature sensing portions 35a. In FIGS. 1 and 2, a trench direction is a direction in which the trenches 18 described hereinafter extend in a striped pattern (similarly in FIGS. 10 and 11). In this manner, in the first embodiment, the first and the third temperature sensing portions 35a, 35c are disposed in the element overall, whereby temperature measurement of the semiconductor chip 60 may be performed over a wide region of the semiconductor chip 60 and accuracy of temperature measurement is enhanced.

Further, in the figure of FIG. 2, first $p^+$-type base regions 4 described hereinafter have connecting regions 4d that extend the first $p^+$-type base regions 4 in a width direction of the trenches 18 and on the connecting regions 4d, second temperature sensing portions 35b are provided. In FIGS. 1 and 2, among solid line segments forming a grid shape, solid line segments in a direction orthogonal to the trenches are the connecting regions 4d (similarly in FIGS. 10 and 11). Portions of the trenches 18 in contact with the connecting regions 4d are regions where current does not pass in the semiconductor chip 60 and therefore, even when the second temperature sensing portions 35b are provided, characteristics of the silicon carbide semiconductor device are not affected. In the figure of FIG. 2, the first to the third temperature sensing portions 35a to c may be disposed in greater number as compared to the figure of FIG. 1, thereby enabling measurement of the temperature of the semiconductor chip 60 over a wider region, whereby the accuracy of temperature measurement is enhanced.

Further, the first to the third temperature sensing portions 35a to c, as described hereinafter, each includes an anode electrode 84 and a cathode electrode 85, the cathode electrode 85 being connected to the cathode electrode pad 36 of the main non-operating region 42b and the anode electrode 84 being connected to a built-in current source 90.

The first to the third temperature sensing portions 35a to c may all be disposed in series or may all be disposed in parallel. Further, the first to the third temperature sensing portions 35a to c may be disposed in series-parallel in which some are disposed in series and some are disposed in parallel. An even number of the first temperature sensing portions 35a and the second temperature sensing portions 35b, excluding the third temperature sensing portion 35c provided at the center of the semiconductor chip 60, may be provided symmetrically and, for example, as depicted in FIGS. 1 and 2, may be provided symmetrically with regard to a line passing through the third temperature sensing portion 35c provided at the center of the semiconductor chip 60, in the trench direction.

The overcurrent protecting portion (not depicted), for example, is a diode that protects the main semiconductor element 42 from overvoltage (OV). The current sensing portion 37a, the temperature sensing portions 35a, and the overcurrent protecting portion are controlled by the arithmetic circuit portion. Based on output signals of the current sensing portion 37a, the temperature sensing portions 35a, and the overcurrent protecting portion, the main semiconductor element 42 is controlled. The arithmetic circuit portion is configured by plural semiconductor elements such as complementary MOS (CMOS) circuits.

Figure 3:
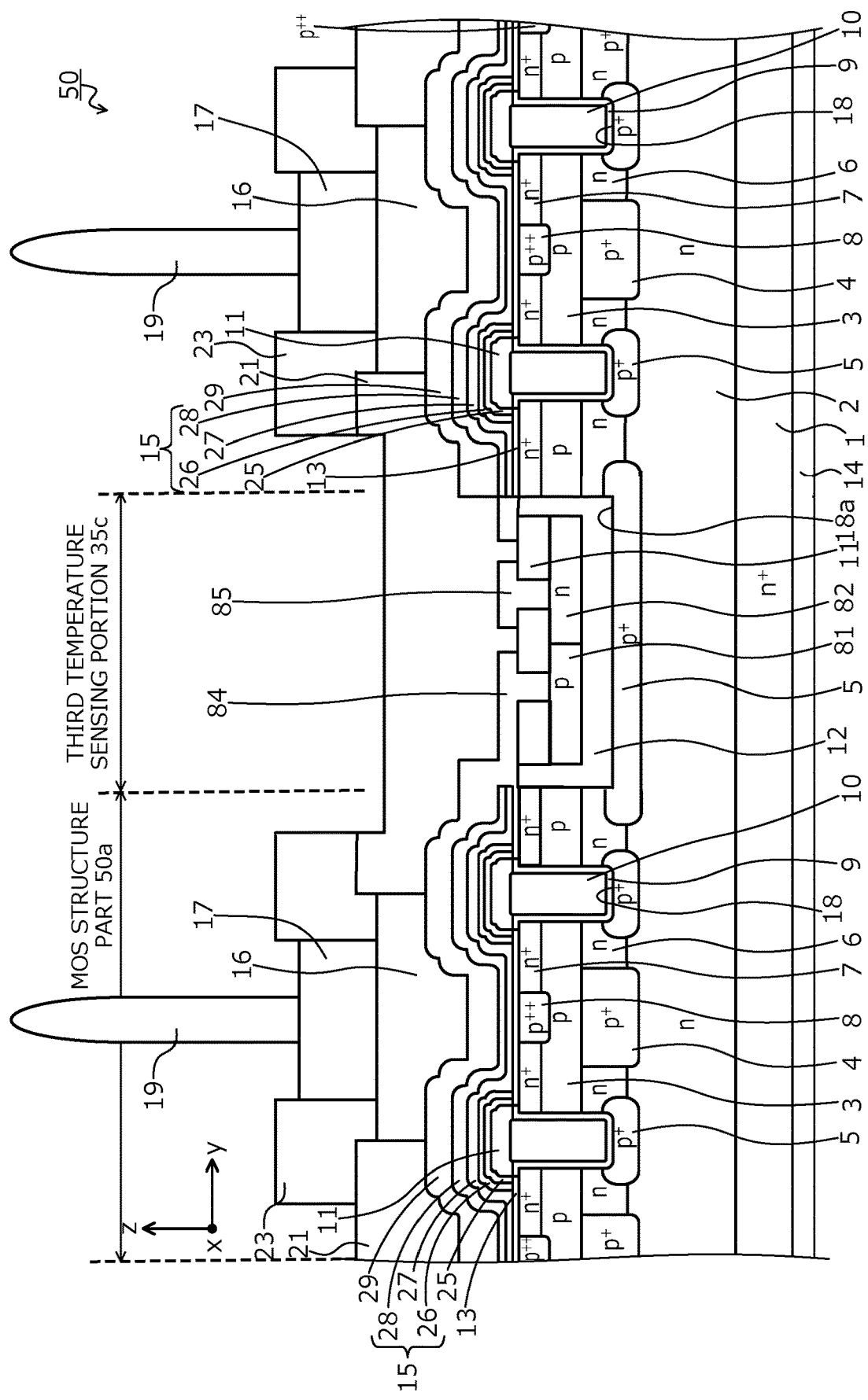
FIG. 3 is a cross-sectional view of the structure of a portion of the silicon carbide semiconductor device according to the first embodiment, at cutting line A-A' in FIG. 2.
Figure 12:
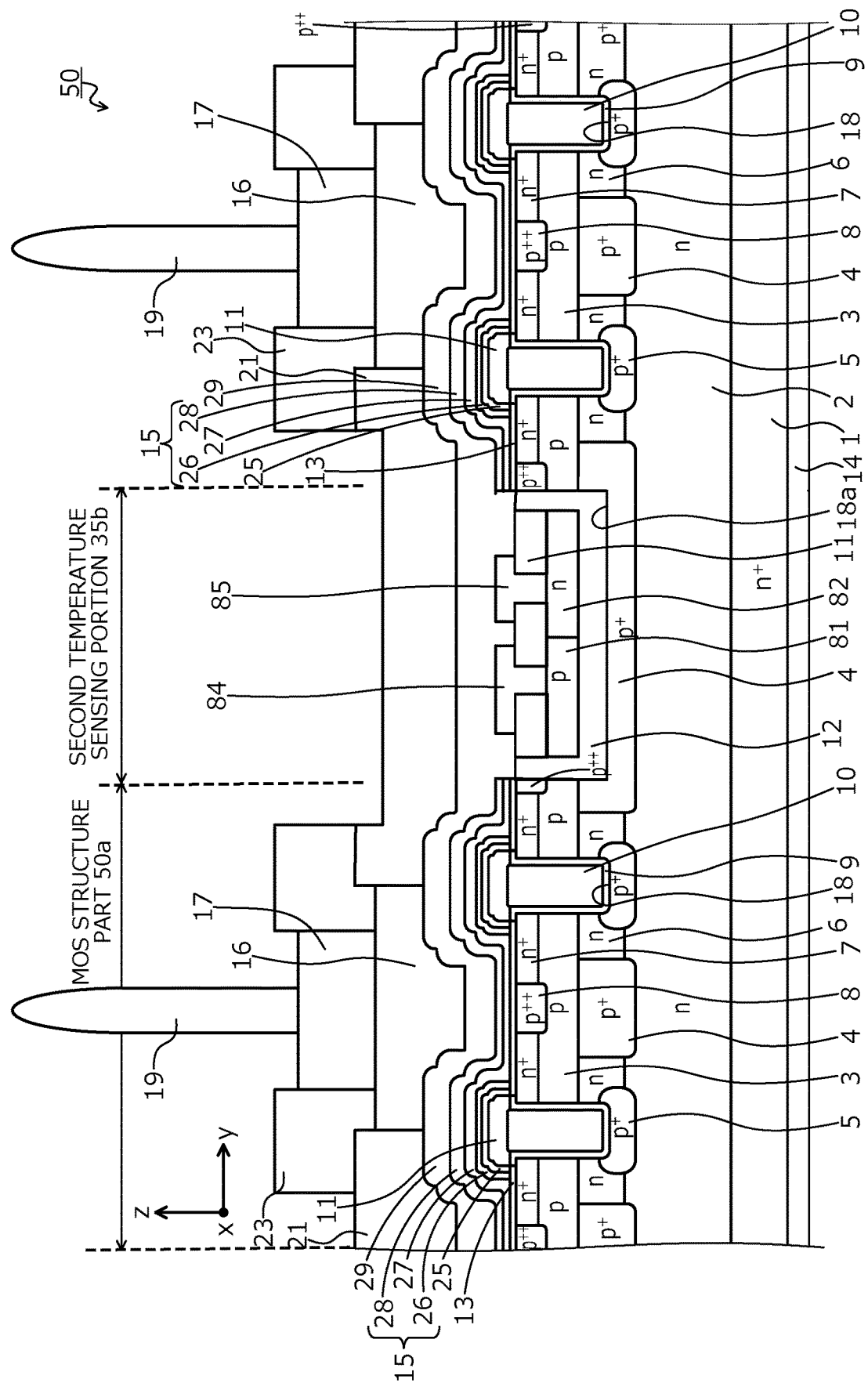
FIG. 12 is a cross-sectional view of the structure of a portion of the silicon carbide semiconductor device according to the second embodiment at cutting line A-A' in FIG. 11.
Figure 13:
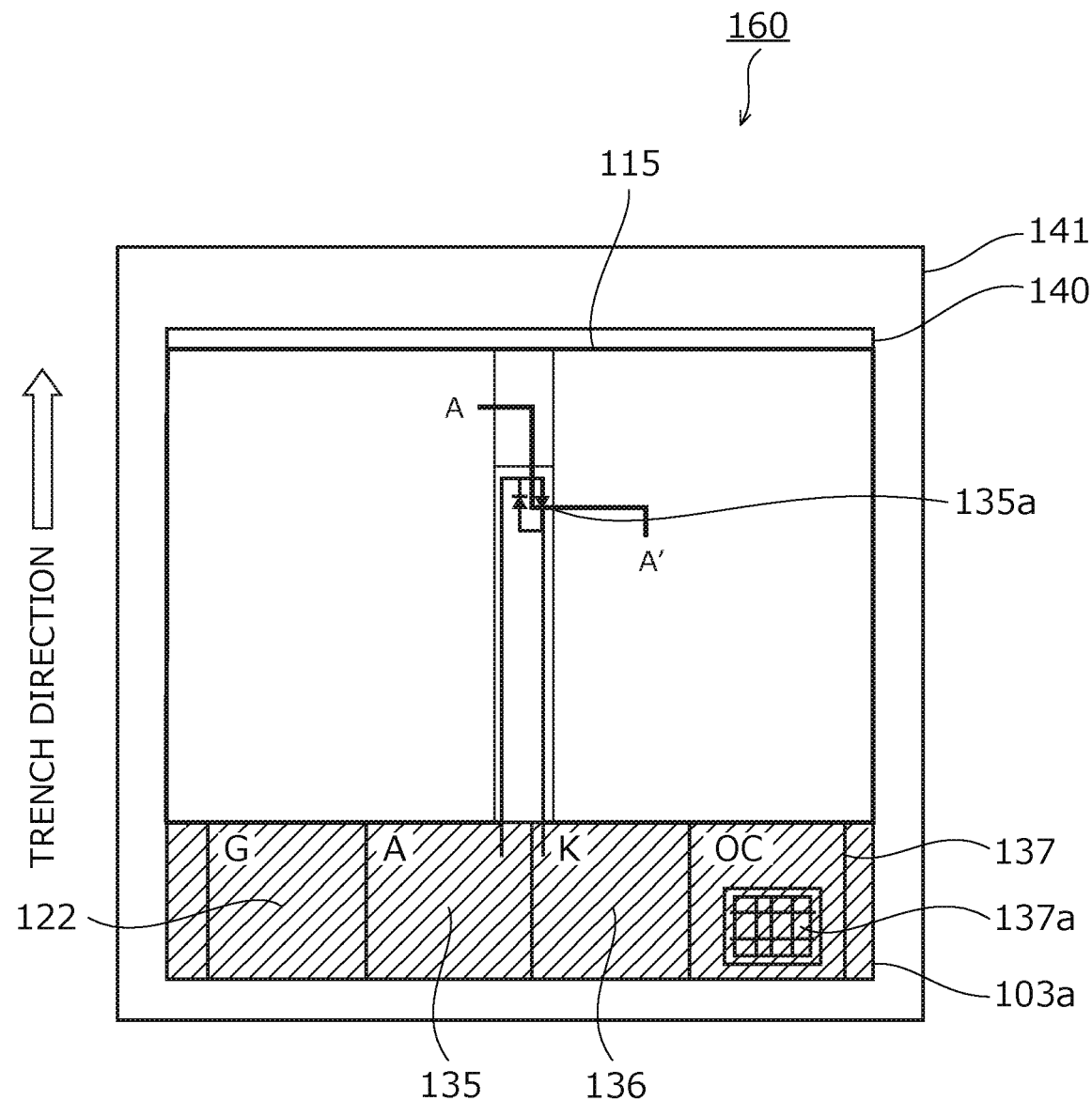
FIG. 13 is a top view of a structure of a conventional silicon carbide semiconductor device.

FIG. 3 is a cross-sectional view of the structure of a portion of the silicon carbide semiconductor device according to the first embodiment, at cutting line A-A' in FIG. 2. The structure of the portion in FIG. 1 at cutting line A-A' is similar to that depicted in FIG. 3 and therefore, is not depicted. FIG. 3 depicts a cross-section of the structure at cutting line A-A' that is from a region (hereinafter, MOS structure part 50a) in which a MOS structure (3-layered structure including a metal, an oxide film, and a semiconductor) of the main effective region 42a in FIG. 2 is formed and passes through the third temperature sensing portion 35c to another MOS structure part 50a of the main effective region 42a. The structure of the first temperature sensing portions 35a is similar to the structure of the third temperature sensing portion 35c depicted in FIG. 3 and the structure of the second temperature sensing portions 35b is depicted in FIG. 12.

As depicted in FIG. 3, in the MOSFET 50 of the silicon carbide semiconductor device according to the present embodiment, an n-type silicon carbide epitaxial layer (first semiconductor layer of the first conductivity type) 2 is deposited at a first main surface (front surface), for example, a (0001) plane (Si-face) of an $n^+$-type silicon carbide substrate (semiconductor substrate of a first conductivity type) 1.

The $n^+$-type silicon carbide substrate 1, for example, is a silicon carbide single crystal substrate doped with nitrogen (N). The n-type silicon carbide epitaxial layer 2 is a low-concentration n-type drift layer, for example, doped with nitrogen to have an impurity concentration that is lower than an impurity concentration of the $n^+$-type silicon carbide substrate 1. N-type high-concentration regions 6 may be provided at a surface of the n-type silicon carbide epitaxial layer 2, on a side of the n-type silicon carbide epitaxial layer 2 opposite that facing the $n^+$-type silicon carbide substrate 1. The n-type high-concentration regions 6 form a high-concentration n-type drift layer having an impurity concentration that is lower than the impurity concentration of the $n^+$-type silicon carbide substrate 1 and higher than the impurity concentration of the n-type silicon carbide epitaxial layer 2.

A p-type base layer (second semiconductor layer of a second conductivity type) 3 is provided at surfaces of the n-type high-concentration regions 6 (in a case in which the n-type high-concentration regions 6 are not provided, the n-type silicon carbide epitaxial layer 2, hereinafter, simply "(2)"), the surfaces on sides of the n-type high-concentration regions 6 (2) opposite those facing the $n^+$-type silicon carbide substrate 1. Hereinafter, the $n^+$-type silicon carbide substrate 1, the n-type silicon carbide epitaxial layer 2, and the p-type base layer 3 are collectively a silicon carbide semiconductor base.

As depicted in FIG. 3, a back electrode (second electrode) 14 is provided at a second main surface (back surface, i.e., back surface of the silicon carbide semiconductor base) of the $n^+$-type silicon carbide substrate 1. The back electrode 14 configures a drain electrode. At a surface of the back electrode 14, a drain electrode pad (not depicted) is provided.

At a first main side of the silicon carbide semiconductor base (side having the p-type base layer 3), a trench structure having a striped pattern is formed. In particular, the trenches 18 penetrate the p-type base layer 3 from a surface of the p-type base layer 3 on a side (the first main side of the silicon carbide semiconductor base) of the p-type base layer 3, opposite that facing the $n^+$-type silicon carbide substrate 1, and the trenches 18 reach the n-type high-concentration regions 6 (2). Along inner walls of the trenches 18, a gate insulating film 9 is formed at bottoms and side walls of the trenches 18; and gate electrodes 10 each having a stripe shape are formed on the gate insulating film 9 in the trenches 18, respectively. The gate electrodes 10 are insulated from the n-type high-concentration regions 6 and the p-type base layer 3 by the gate insulating film 9. A portion of each of the gate electrodes 10 extends from a top of each of the trenches 18, toward the source electrode pad 15 described hereinafter.

The first $p^+$-type base regions (second semiconductor regions of the second conductivity type) 4 are selectively provided in surface layers of sides (the first main side of the silicon carbide semiconductor base) of the n-type high-concentration regions 6 (2), opposite sides of the n-type high-concentration regions 6 (2) facing the n$^+$-type silicon carbide substrate 1. Second p$^+$-type base regions (third semiconductor regions of the second conductivity type) 5 are formed beneath the trenches 18, respectively, and the second p$^+$-type base regions 5 each have a width that is wider than a width of one of the trenches 18. The first p$^+$-type base regions 4 and the second p$^+$-type base regions 5, for example, are doped with aluminum.

Extended portions of the first p$^+$-type base regions 4 extend toward the trenches 18, whereby a structure is formed in which the second p$^+$-type base regions 5 are connected to the first p$^+$-type base regions 4. The extended portions of the first p$^+$-type base regions 4 may have a planar layout in which the extended portions of the first p$^+$-type base regions 4 are disposed to repeatedly alternate the n-type high-concentration regions 6 (2), in a direction (hereinafter, second direction) x orthogonal to a direction (hereinafter, first direction) y in which the first p$^+$-type base regions 4 and the second p$^+$-type base regions 5 are arranged. For example, periodically in the second direction x, a structure may be disposed in which the connecting regions 4d are provided and connected to the second p$^+$-type base regions 5, the connecting regions 4d being the extended portions of the first p$^+$-type base regions 4 extending toward the trenches 18 on each side thereof in the first direction y. A reason for this is that as a result, holes generated when avalanche breakdown occurs at contact portions between the n-type silicon carbide epitaxial layer 2 and the second p$^+$-type base regions 5 are efficiently migrated to source electrodes (first electrodes) 13, whereby load to the gate insulating film 9 is reduced and reliability is increased. For example, the first p$^+$-type base regions 4, the connecting regions 4d, and the second p$^+$-type base regions 5 collectively may form a grid shape in a plan view.

In the p-type base layer 3, at a base first surface side thereof, n$^+$-type source regions (first semiconductor regions of the first conductivity type) 7 are selectively provided. Further, p$^{++}$-type contact regions 8 may be provided. The n$^+$-type source regions 7 are in contact with the trenches 18. Further, the n$^+$-type source regions 7 and the p$^{++}$-type contact regions 8 are in contact with each other.

The n-type high-concentration regions 6 (2) are provided in regions sandwiched by the second p$^+$-type base regions 5 and the first p$^+$-type base regions 4 of a surface layer of a base first surface side of the n-type silicon carbide epitaxial layer 2 and in regions sandwiched by the p-type base layer 3 and the second p$^+$-type base regions 5.

An interlayer insulating film 11 is provided at an entire surface of the first main side of the silicon carbide semiconductor base so as to cover the gate electrodes 10 embedded in the trenches 18. The source electrodes 13 are in contact with the n$^+$-type source regions 7 and the p-type base layer 3, via contact holes opened in the interlayer insulating film 11, and are in contact with the n$^+$-type source regions 7 and the p$^{++}$-type contact regions 8, when the p$^{++}$-type contact regions 8 are provided. The source electrodes 13, for example, are formed from a NiSi film. The contact holes opened in the interlayer insulating film 11 have a stripe shape corresponding to the shape of the gate electrodes 10. The source electrodes 13 are electrically insulated from the gate electrodes 10 by the interlayer insulating film 11. On the source electrodes 13, the source electrode pad 15 is provided. The source electrode pad 15, for example, is formed by a first TiN film 25, a first Ti film 26, a second TiN film 27, a second Ti film 28, and an Al alloy film 29 that are stacked. Between the interlayer insulating film 11 and the source electrodes 13, for example, a barrier metal (not depicted) that prevents diffusion of metal atoms from the source electrodes 13 to the gate electrodes 10 may be provided.

At a top of the source electrode pad 15, plating films 16 are selectively provided and a solder 17 is selectively provided at a surface side of the plating films 16. At the solder 17, the external terminal electrodes 19 that are wiring members that lead out electric potential of the source electrodes 13 to an external destination are provided. The external terminal electrodes 19 have a needle-like pin shape and are bonded in an upright state to the source electrode pad 15.

A portion other than the plating films 16 of the surface of the source electrode pad 15 is covered by a first protective film 21. In particular, the first protective film 21 is provided so as to cover the source electrode pad 15, and the external terminal electrodes 19 are bonded at openings in the first protective film 21, via the plating films 16 and the solder 17. Borders between the first protective film 21 and the plating films 16 are covered by a second protective film 23. The first protective film 21 and the second protective film 23, for example, are polyimide films.

At the first to the third temperature sensing portions 35a to c, a polysilicon diode is formed by the p-type polysilicon layer 81 and the n-type polysilicon layer 82 that are in contact with one another. The polysilicon diode is provided in temperature sensing trenches (second trench) 18a, via an insulating film 12. The temperature sensing trenches 18a penetrate the p-type base layer 3 from a surface of the p-type base layer 3 on a side of the p-type base layer 3 opposite that facing the n$^+$-type silicon carbide substrate 1 and the temperature sensing trenches 18a reach the first p$^+$-type base regions 4 (when the first p$^+$-type base regions 4 are not provided, the n-type silicon carbide epitaxial layer 2). The insulating film 12 may have a thickness that is thicker than a thickness of the gate insulating film 9 in the trenches 18 of the MOS structure part 50a or may have a thickness that is about equal thereto. The temperature sensing trenches 18a may have a shape similar to that of the trenches 18 of the MOS structure part 50a or may have a shape that differs from that of the trenches 18. For example, the temperature sensing trenches 18a may have a trench width that is wider than that of the trenches 18 of the MOS structure part 50a and a depth that is deeper than that of the trenches 18.

The p-type polysilicon layers 81 and the n-type polysilicon layers 82 are connected to the anode electrodes 84 and the cathode electrodes 85, respectively. The anode electrodes 84 extend toward the MOS structure part 50a and are connected to the source electrodes 13; and a main current of the internal current source 90 is applied to the anode electrodes 84. The internal current source 90 selectively separates a portion of the active region 40 and is formed by an aluminum electrode, and is connected to the anode electrode 84 of the diode of the third temperature sensing portion 35c. A source electric potential is common to p-type regions in the active region 40 and an electric potential of the p-type regions is set to be the source electric potential of the separated active region 40. Alternatively, the aluminum electrode is completely separate and a main portion of the active region 40 and the active region 40 separated as the internal current source 90 may be shorted. A separated individual MOS structure configures the internal current source 90 of the diode of the third temperature sensing portion 35c. The internal current source 90 that uses a portion of the active region 40 has a mathematical area corresponding to a current value necessary for the diode of the third temperature sensing portion 35c. Alternatively, a Vth, etc. corresponding to the internal current source 90 may be adjusted according to the current necessary. To operate similarly to a normal MOSFET, when voltage at least equal to a threshold is applied to the gate electrodes 10 and the MOSFET enters an ON state, the internal current source 90 also concurrently enters the ON state. Current flows from the back electrode 14 to the source electrodes 13. The source electrodes 13 of the MOS structure parts 50a are connected to the anode electrodes 84 and therefore, current flows from the anode electrodes 84 to the cathode electrodes 85 and the diodes of the first to the third temperature sensing portions 35a to c enter the ON state.

In this manner, in the first embodiment, the diodes of the first to the third temperature sensing portions 35a to c enter the ON state, i.e., the temperature may be measured only when the MOSFET is in the ON state. Therefore, in the MOS structure parts 50a, some of the source electrodes 13 and the gate electrodes 10 are separated and connected to the anode electrodes 84 of the first to the third temperature sensing portions 35a to c, whereby the diodes of the first to the third temperature sensing portions 35a to c may be in a steady ON state. Further, direct current voltage at least equal to a threshold voltage may be applied to the gate electrodes 10 of the MOS structure part 50a, to which the anode electrodes 84 of the first to the third temperature sensing portions 35a to c are connected, whereby the diodes of the first to the third temperature sensing portions 35a to c may be in a steady ON state.

Figure 14:
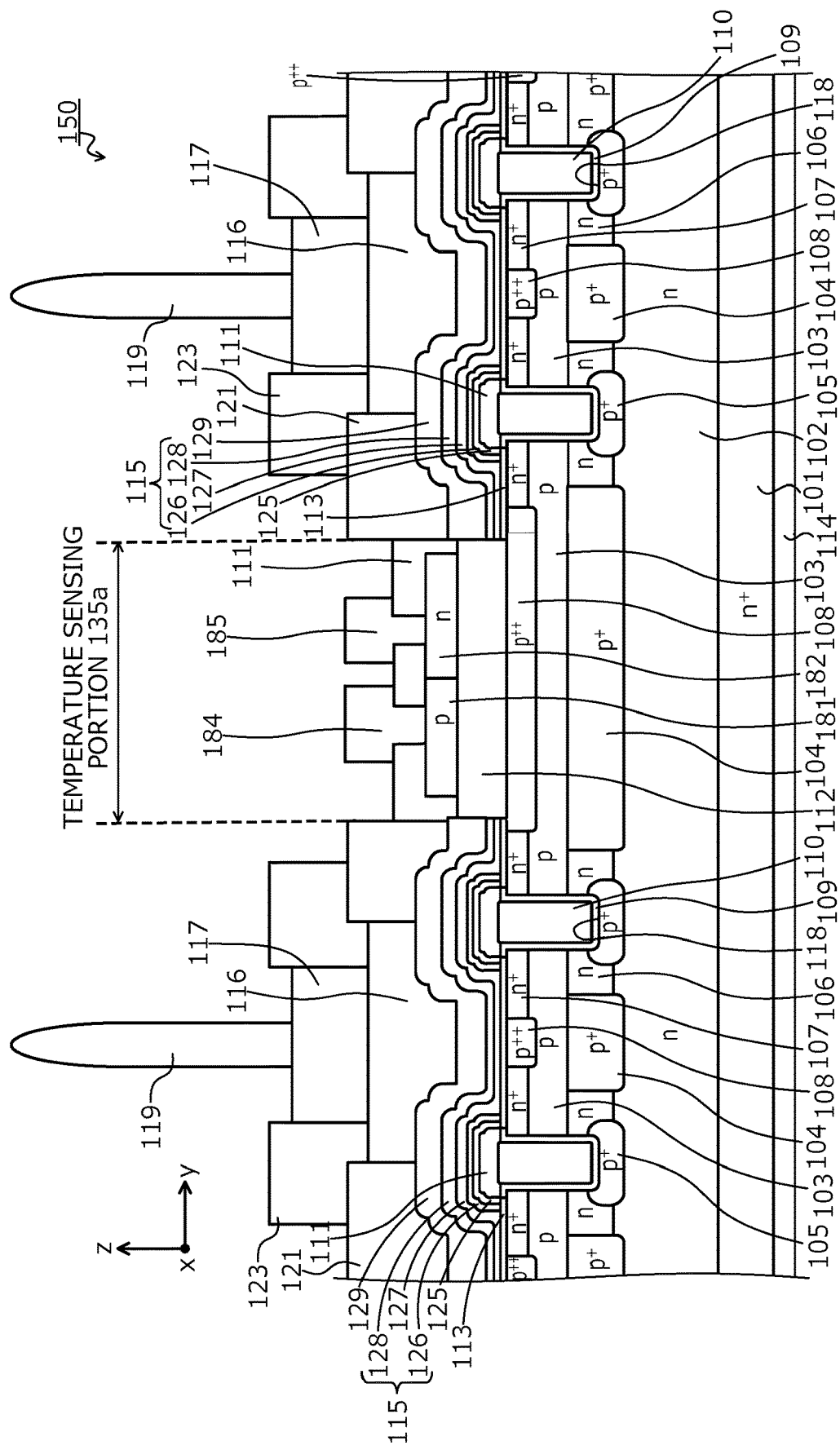
FIG. 14 is a cross-sectional view of the structure of a portion of the conventional silicon carbide semiconductor device at cutting line A-A' in FIG. 13.

Further, in the conventional silicon carbide semiconductor device, the insulating film 112 is formed at the surface of the $p^{++}$-type contact region 108 and the diode of the temperature sensing portion 135a is formed on the surface of the insulating film 112 (refer to FIG. 14). Therefore, the temperature in the element cannot be measured accurately and as a result, the accuracy of temperature measurement drops. In contrast, in the first embodiment, the diodes of the first to the third temperature sensing portions 35a to c are provided in the insulating film 12 embedded in the temperature sensing trenches 18a and are positioned closer to a heat source as compared to that in the conventional silicon carbide semiconductor device, thereby enabling the temperature in the element to be measured accurately and the accuracy of temperature measurement to be enhanced.

A method of manufacturing the silicon carbide semiconductor device according to the first embodiment will be described. FIGS. 4, 5, 6, 7, 8, and 9 are cross-sectional views schematically depicting states of the silicon carbide semiconductor device according to the first embodiment during manufacture.

Figure 4:
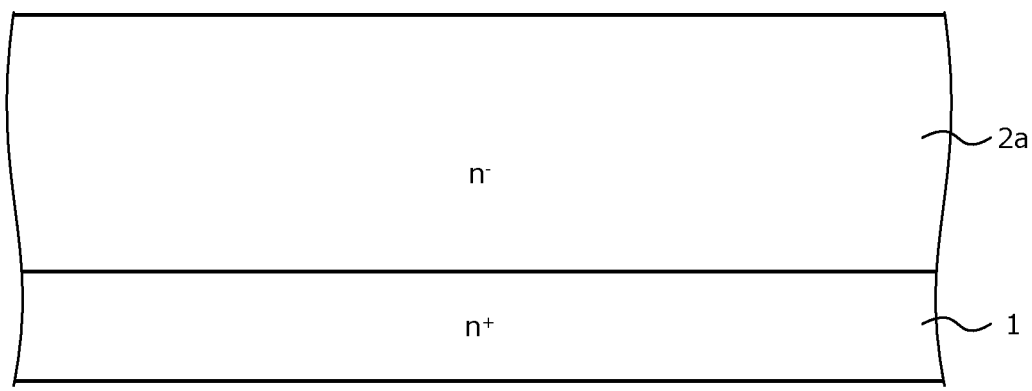
FIG. 4 is a cross-sectional view schematically depicting a state of the silicon carbide semiconductor device according to the first embodiment during manufacture.

First, the $n^+$-type silicon carbide substrate 1 containing an n-type silicon carbide is prepared. Subsequently, on the first main surface of the $n^+$-type silicon carbide substrate 1, a first n-type silicon carbide epitaxial layer 2a containing silicon carbide is formed by epitaxial growth to have a thickness of, for example, about 30 μm while an n-type impurity, for example, nitrogen atoms is doped. The first n-type silicon carbide epitaxial layer 2a forms the n-type silicon carbide epitaxial layer 2. The state up to here is depicted in FIG. 4.

Next, on the surface of the first n-type silicon carbide epitaxial layer 2a, an ion implantation mask having predetermined openings is formed by a photolithographic technique using, for example, an oxide mask. Subsequently, a p-type impurity such as aluminum is implanted in the openings of the oxide film, thereby forming lower first $p^+$-type base regions 4a of a depth of about 0.5 μm. Concurrently with the lower first $p^+$-type base regions 4a, the second $p^+$-type base regions 5 that form the bottoms of the trenches 18 may be formed. Formation is such that a distance between each of the first $p^+$-type base regions 4a and a corresponding one the second $p^+$-type base regions 5 adjacent thereto is about 1.5 μm. An impurity concentration of the lower first $p^+$-type base regions 4a and the second $p^+$-type base regions 5 is set to be, for example, about $5 \times 10^{18}/cm^3$.

Figure 5:
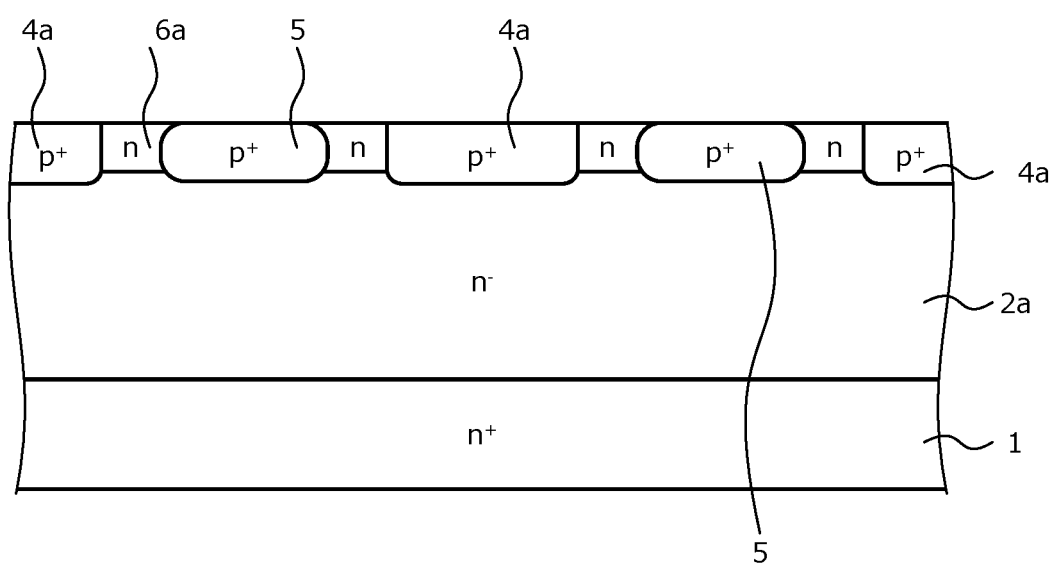
FIG. 5 is a cross-sectional view schematically depicting a state of the silicon carbide semiconductor device according to the first embodiment during manufacture.

Next, portions of the ion implantation mask are removed, an n-type impurity such as nitrogen is ion implanted in the openings, thereby providing in a portions of a surface region of the first n-type silicon carbide epitaxial layer 2a, lower n-type high-concentration regions 6a of a depth of, for example, about 0.5 μm. An impurity concentration of the lower n-type high-concentration regions 6a is set to be, for example, about $1 \times 10^{17}/cm^3$. The state up to here is depicted in FIG. 5.

Next, on the surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer 2b is set to be about $3 \times 10^{15}/cm^3$. Hereinafter, the first n-type silicon carbide epitaxial layer 2a and the second n-type silicon carbide epitaxial layer 2b collectively are the n-type silicon carbide epitaxial layer 2.

Next, on the surface of the second n-type silicon carbide epitaxial layer 2b, an ion implantation mask having predetermined openings is formed by photolithography using, for example, an oxide film. Subsequently, a p-type impurity such as aluminum is implanted in the openings of the oxide film, thereby forming upper first $p^+$-type base regions 4b so as to overlap the lower first $p^+$-type base regions 4a, the upper first $p^+$-type base regions 4b having a thickness of about 0.5 μm. Regions where the lower first $p^+$-type base regions 4a and the upper first $p^+$-type base regions 4b are respectively connected are formed, thereby forming the first $p^+$-type base regions 4. An impurity concentration of the upper first $p^+$-type base regions 4b is set to be, for example, about $5 \times 10^{18}/cm^3$.

Figure 6:
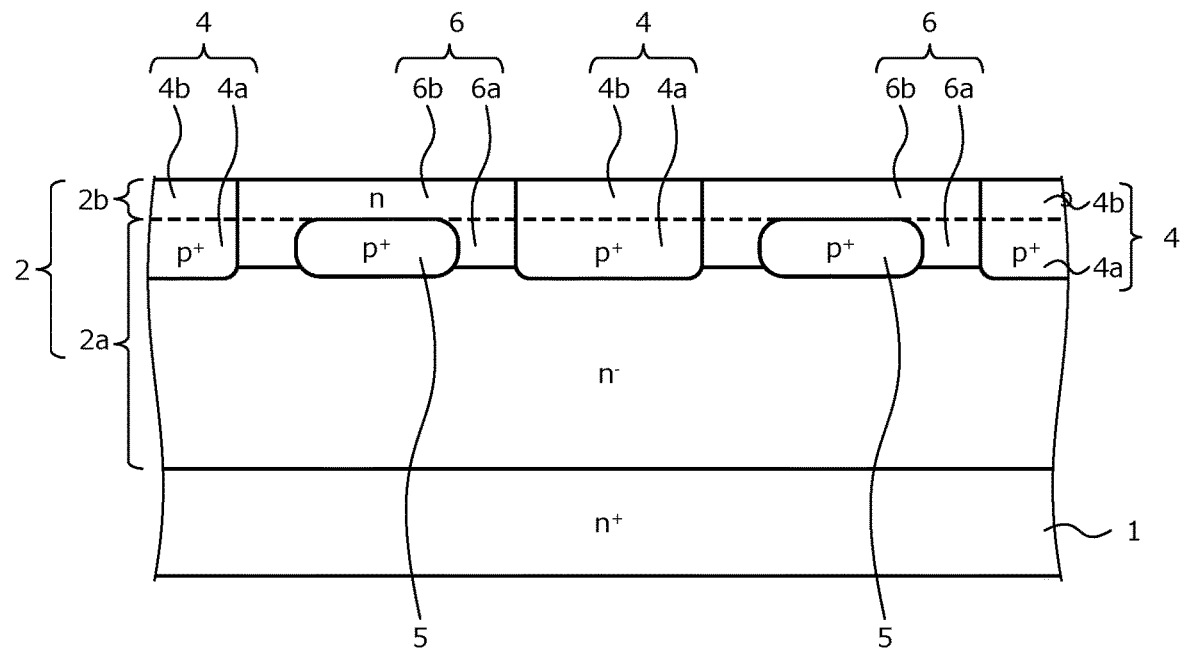
FIG. 6 is a cross-sectional view schematically depicting a state of the silicon carbide semiconductor device according to the first embodiment during manufacture.

Next, portions of the ion implantation mask are removed and an n-type impurity such as nitrogen is ion implanted in the openings, thereby providing in portions of a surface of the second n-type silicon carbide epitaxial layer 2b, upper n-type high-concentration regions 6b of a depth of, for example, about 0.5 μm. An impurity concentration of the upper n-type high-concentration regions 6b is set to be, for example, about $1 \times 10^{17}/cm^3$. The upper n-type high-concentration regions 6b and the lower n-type high-concentration regions 6a are formed to at least partially contact one another and, thereby, form the n-type high-concentration regions 6. However, the n-type high-concentration regions 6 may be formed at an entire substrate surface or may be omitted. The state up to here is depicted in FIG. 6.

Next, on the surface of the n-type silicon carbide epitaxial layer 2, the p-type base layer 3 doped with a p-type impurity such as aluminum is formed to have a thickness of about 1.3 μm. An impurity concentration of the p-type base layer 3 is set to about $4 \times 10^{17}/cm^3$.

Figure 7:
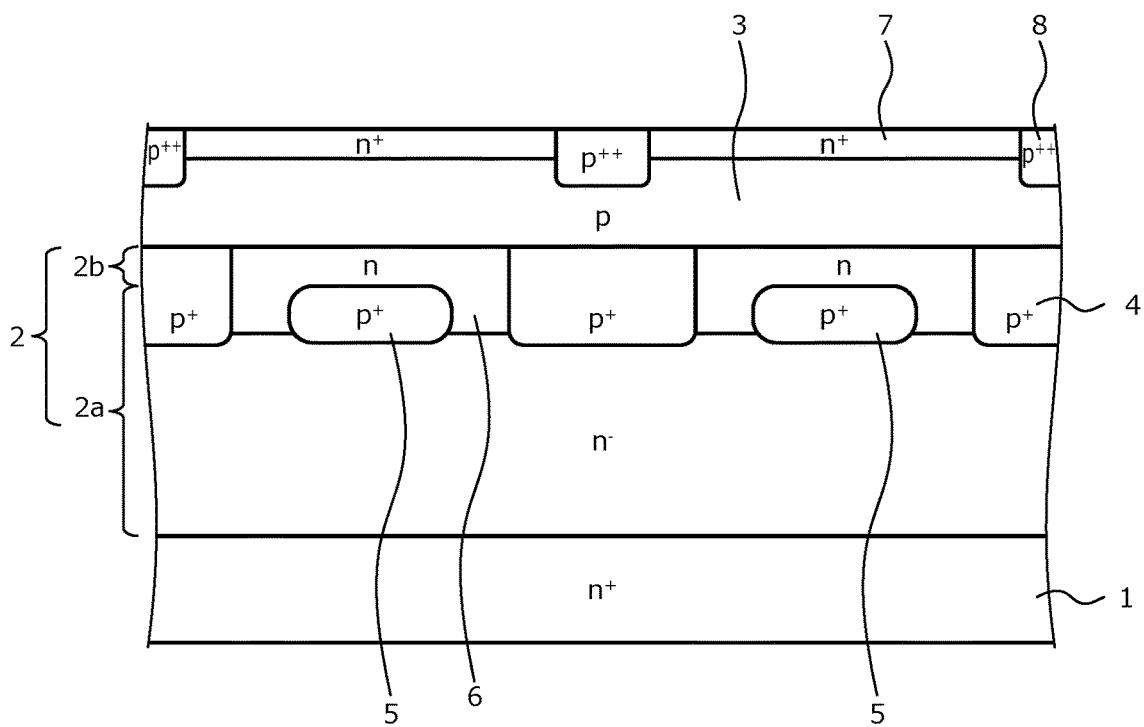
FIG. 7 is a cross-sectional view schematically depicting a state of the silicon carbide semiconductor device according to the first embodiment during manufacture.

Next, on the surface of the p-type base layer 3, an ion implantation mask having predetermined openings is formed by photolithography using, for example, an oxide film. An n-type impurity such as phosphorus (P) is ion implanted in the openings, thereby forming the $n^+$-type source regions 7 in portions of the surface of the p-type base layer 3. An impurity concentration of the n$^+$-type source regions 7 is set to be higher than the impurity concentration of the p-type base layer 3. Next, the ion implantation mask used in forming the n$^+$-type source regions 7 is removed and by a similarly method, an ion implantation mask having predetermined openings may be formed and a p-type impurity such as aluminum may be ion implanted in portions of the surface of the p-type base layer 3, whereby the p$^{++}$-type contact regions 8 may be formed. An impurity concentration of the p$^{++}$-type contact regions 8 is set to be higher than the impurity concentration of the p-type base layer 3. The state up to here is depicted in FIG. 7.

Next, a heat treatment (annealing) in an inert gas atmosphere at about 1700 degrees C. is performed, thereby implementing an activation process of the first p$^+$-type base regions 4, the second p$^+$-type base regions 5, the n$^+$-type source regions 7, and the p$^{++}$-type contact regions 8. As described above, ion implanted regions may be collectively activated by a single session of the heat treatment or may be activated by performing the heat treatment each time ion implantation is performed.

Figure 8:
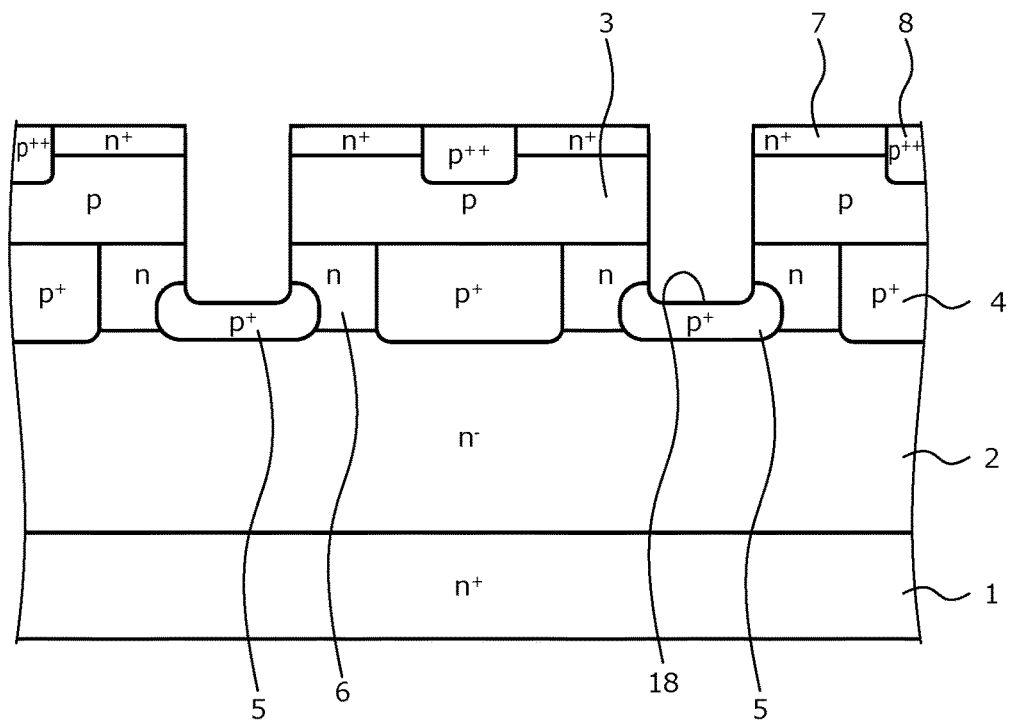
FIG. 8 is a cross-sectional view schematically depicting a state of the silicon carbide semiconductor device according to the first embodiment during manufacture.

Next, on the surface of the p-type base layer 3, a trench forming mask having predetermined openings is formed by photolithography using, for example, an oxide film. Next, the trenches 18 that penetrate the p-type base layer 3 and reach the n-type high-concentration regions 6 (2) are formed by dry etching. The bottoms of the trenches 18 may reach the second p$^+$-type base regions 5 formed in the n-type high-concentration regions 6 (2). Next, the trench forming mask is removed. The state up to here is depicted in FIG. 8.

Next, along the surfaces of the n$^+$-type source regions 7 and along the bottoms and the side walls of the trenches 18, the gate insulating film 9 is formed. The gate insulating film 9 may be formed by thermal oxidation of a temperature of about 1000 degrees C. in an oxygen atmosphere. Further, the gate insulating film 9 may be formed by a deposition method by a chemical reaction such as that for a high temperature oxide (HTO).

Next, on the gate insulating film 9, for example, a polycrystalline silicon layer doped with phosphorus atoms is provided. The polycrystalline silicon layer may be formed so as to be embedded in the trenches 18. The polycrystalline silicon layer is patterned by photolithography and left in the trenches 18, thereby forming the gate electrodes 10.

Figure 9:
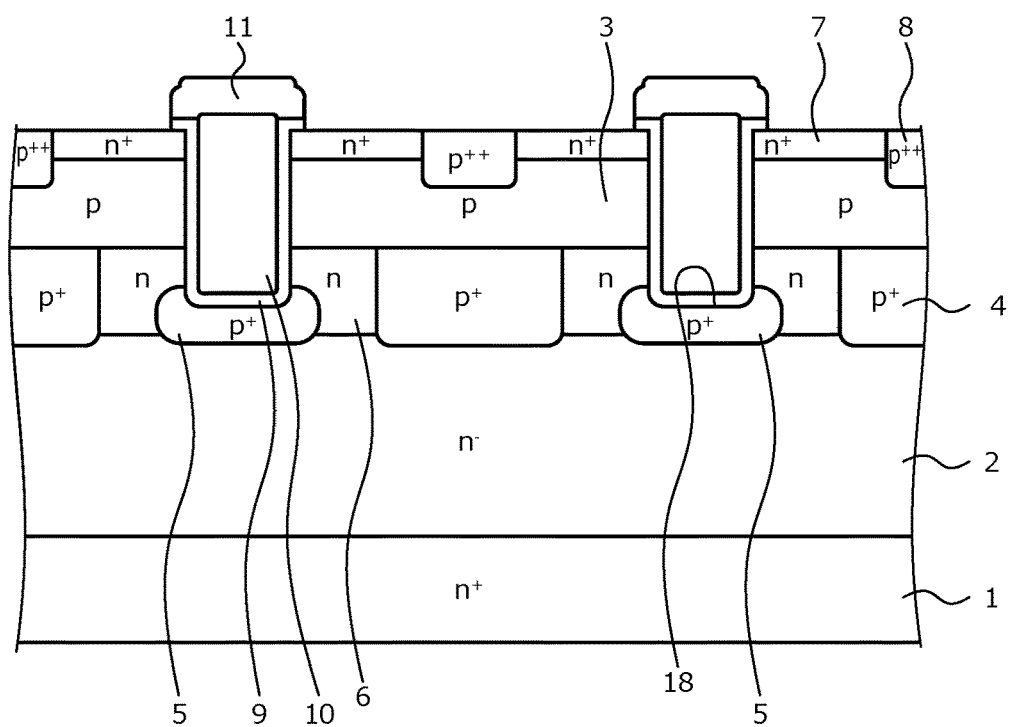
FIG. 9 is a cross-sectional view schematically depicting a state of the silicon carbide semiconductor device according to the first embodiment during manufacture.

Next, for example, a phosphate glass is deposited so as to cover the gate insulating film 9 and the gate electrodes 10 and have a thickness of about 1 μm, thereby forming the interlayer insulating film 11. Next, the barrier metal (not depicted) containing titanium (Ti) or titanium nitride (TiN) may be formed so as to cover the interlayer insulating film 11. The interlayer insulating film 11 and the gate insulating film 9 are patterned by photolithography, thereby forming contact holes that expose the n$^+$-type source regions 7 and the p$^{++}$-type contact regions 8. Thereafter, a heat treatment (reflow) is performed, thereby planarizing the interlayer insulating film 11. The state up to here is depicted in FIG. 9.

Next, in the contact holes and on the interlayer insulating film 11, a conductive film that forms the source electrodes 13 is provided. The conductive film is selectively removed, leaving the source electrodes 13 only in the contact holes, whereby the n$^+$-type source regions 7 and the p$^{++}$-type contact regions 8 are in contact with the source electrodes 13. Next, the source electrodes 13 excluding those in the contact holes are selective removed.

Next, for example, by a sputtering method, on the source electrodes 13 of the front surface of the silicon carbide semiconductor base and at an upper portion of the interlayer insulating film 11, an electrode pad forming the source electrode pad 15 is deposited. For example, by a sputtering method, the first TiN film 25, the first Ti film 26, the second TiN film 27, and the second Ti film 28 are stacked and the Al alloy film 29 is further formed so that the thickness, for example, becomes about 5 μm. The Al alloy film 29 may be an Al film. The Al alloy film 29, for example, is an Al—Si film or an Al—Si—Cu. The conductive film is patterned by photolithography and is left in the active region 40 of the element overall, whereby the source electrode pad 15 is formed. A thickness of a portion of the electrode pad on the interlayer insulating film 11 may be, for example, about 5 μm. The electrode pad, for example, may be formed by aluminum (Al—Si) containing 1% silicon. Next, the source electrode pad 15 is selectively removed.

Next, a polyimide film is formed so as to cover the source electrode pad 15. Next, the polyimide film is selectively removed by photolithography and etching, whereby the first protective film 21 is formed covering the source electrode pad 15 and the first protective film 21 is opened.

Next, on the source electrode pad 15, the plating films 16 are selectively provided, the second protective film 23 that covers borders between the plating films 16 and the first protective film 21 is formed. Next, the external terminal electrodes 19 are formed at the plating films 16 via the solder 17.

Next, on the second main surface of the n$^+$-type silicon carbide semiconductor substrate 1, the back electrode 14 containing, for example, nickel is provided. Thereafter, a heat treatment in an inert gas atmosphere of 1000 degrees C. is performed, thereby forming the back electrode 14 to be in ohmic contact with the n$^+$-type silicon carbide semiconductor substrate 1.

All elements (for example, the current sensing portion 37a, for example, diffusion diodes forming the first to the third temperature sensing portions 35a to c and the overcurrent protecting portion, the complementary MOS (CMOS) configuring the arithmetic circuit portion) other than the main semiconductor element 42 suffice to be formed in the main non-operating region 42b of the semiconductor substrate chip 60, concurrently with corresponding parts of the main semiconductor element 42 in the formation of the parts of the main semiconductor element 42 described above. Further, the elements may be formed by processes separate from those of the main semiconductor element 42.

The first to the third temperature sensing portions 35a to c are formed as follows. When the trenches 18 of the main semiconductor element 42 are formed, the temperature sensing trenches 18a are concurrently formed. Next, when the gate insulating film 9 of the main semiconductor element 42 is formed, the insulating film 12 of the first to the third temperature sensing portions 35a to c is formed. Here, the insulating film 12 may be formed to have a thickness greater than that of the gate insulating film 9 or may be formed to have a thickness that is about equal thereto. Next, on an upper portion of the insulating film 12 formed, a non-doped polysilicon is formed. At a portion of the formed polysilicon, an anode portion and a cathode portion are formed, whereby the p-type polysilicon layer 81 and the n-type polysilicon layer 82 are formed. Next, when the interlayer insulating film 11 of the main semiconductor element 42 is formed, the interlayer insulating films 11 of the first to the third temperature sensing portions 35a to c are formed. Next, when the source electrodes 13 of the main semiconductor element 42 are formed, the anode electrodes 84 and the cathode electrodes 85 are formed. As described above, the silicon carbide semiconductor device depicted in FIGS. 1 to 3 is completed.

As described above, according to the silicon carbide semiconductor device according to the first embodiment, the temperature sensing portions are provided so that the trenches are interrupted in the direction in which the trenches of the MOS structure part 50*a* extend in the striped pattern. As a result, the temperature sensing portions are disposed in the element overall, thereby enabling temperature measurement of the semiconductor chip to be performed over a wide region of the semiconductor chip and the accuracy of temperature measurement to be enhanced.

Further, according to the silicon carbide semiconductor device according to the first embodiment, the diodes of the temperature sensing portions are provided in the insulating film embedded in the trenches, thereby enabling accurate measurement of the temperature in the element and the accuracy of temperature measurement to be enhanced.

FIG. 10 is a top view depicting a structure of a silicon carbide semiconductor device according to a second embodiment. FIG. 11 is a top view depicting another structure of the silicon carbide semiconductor device according to the second embodiment. FIG. 12 is a cross-sectional view of the structure of a portion of the silicon carbide semiconductor device according to the second embodiment at cutting line A-A' in FIG. 11. The structure of the portion in FIG. 10 at cutting line A-A' is similar to that depicted in FIG. 12 and therefore, is not depicted.

The silicon carbide semiconductor device according to the second embodiment differs from the silicon carbide semiconductor device according to the first embodiment in that the anode electrodes 84 are not connected to the source electrodes 13 and are connected to an anode electrode pad 35. In FIGS. 10 and 11, the anode electrode pad 35 is depicted in a rectangular shape appended with "A". In this manner, in the second embodiment, the built-in current source is not used for the current that is applied to the first to the third temperature sensing portions 35*a* to *c* and a method of supplying power from an external source is adopted. Therefore, in the second embodiment, the diodes of the first to the third temperature sensing portions 35*a* to *c* may be in a steady ON state. A connection electrode between the anode electrode pad 35 and the anode electrodes 84 may be an Al electrode, a Ti electrode, or a TiN electrode.

In the second embodiment, a method of manufacturing the active region 40 is similar to that of the first embodiment and therefore, description thereof is omitted. Further, a method of manufacturing the current sensing portion 37*a* is similar to that of the first embodiment and therefore, description thereof is omitted.

As described above, according to the silicon carbide semiconductor device according to the second embodiment, effects similar to those of the first embodiment are obtained. Further, in the second embodiment, power is supplied from an external source and therefore, the diodes of the temperature sensing portions may be in a steady ON state.

In the foregoing, as an example, while a case has been described in which the main surface of the silicon carbide substrate containing silicon carbide is a (0001) plane and on the (0001) plane, a MOS is configured, the present invention is not limited hereto, and various modifications are possible such as regarding the wide bandgap semiconductor material, plane orientation of the main surface of the substrate, etc.

Further, in the embodiments of the present invention, while a trench-type MOSFET has been described as an example, without limitation hereto, application is further possible to semiconductor devices having various types of configurations such as MOS-type semiconductor devices like planar-type MOSFETs, IGBTs, etc. Further, in the embodiments described above, while a case is described in which silicon carbide is used as a wide bandgap semiconductor material, similar effects are obtained when a wide bandgap semiconductor material other than silicon carbide such as gallium nitride (GaN) is used. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the temperature sensing portions are provided so that the trenches are interrupted in the direction in which the trenches of the MOS structure part extend in the striped pattern. As a result, the temperature sensing portions are disposed in the element overall, thereby enabling temperature measurement of the semiconductor chip to be performed over a wide region of the semiconductor chip and the accuracy of temperature measurement to be enhanced.

Further, according to the invention described above, the diodes in the temperature sensing portions are disposed in the insulating film embedded in the trenches and therefore, the temperature in the element may be accurately measured and the accuracy of temperature measurement may be enhanced.

The semiconductor device and the method of manufacturing a semiconductor device according to the present invention achieve an effect in that the accuracy of temperature measurement of the temperature sensing portions is enhanced.

As described above, the semiconductor device and the method of manufacturing a semiconductor device according to the present invention are useful for high-voltage semiconductor devices used in power converting equipment and in power source devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a MOS structure part that includes:
a semiconductor substrate of a first conductivity type, having a front surface and a back surface opposite to the front surface,
a first semiconductor layer of the first conductivity type, provided at the front surface of the semiconductor substrate and having an impurity concentration that is lower than an impurity concentration of the semiconductor substrate, the first semiconductor layer having a first side and a second side that is opposite to the first side and faces the semiconductor substrate,
a second semiconductor layer of a second conductivity type, provided at the first side of the first semiconductor layer and having a first side and a second side that is opposite to the first side and faces the semiconductor substrate, a plurality of first semiconductor regions of the first conductivity type, selectively provided in a surface layer of the first side of the second semiconductor layer, a plurality of first trenches each penetrating a corresponding one of the plurality of first semiconductor regions and the second semiconductor layer, and reaching the first semiconductor layer, a plurality of gate electrodes each provided in a corresponding one of the plurality of first trenches, via a gate insulating film, an interlayer insulating film provided on the plurality of gate electrodes, a first electrode provided at the first side of the second semiconductor layer and the first side of the plurality of first semiconductor regions, and a second electrode provided at the back surface of the semiconductor substrate; and a plurality of temperature sensing portions, each of which is provided in a region through which a main current flows in an ON state of the semiconductor device, and each of the plurality of temperature sensing portions includes:

the semiconductor substrate, the first semiconductor layer, a second trench provided in the second semiconductor layer, a first polysilicon layer of the first conductivity type and a second polysilicon layer of the second conductivity type, provided in the second trench via an insulating film, a cathode electrode electrically connected to the first polysilicon layer, and an anode electrode electrically connected to the second polysilicon layer, wherein the plurality of first trenches of the MOS structure part each extend so that the plurality of first trenches form a striped pattern, and each of the plurality of temperature sensing portions is provided so as to discontinue a corresponding one of the plurality of first trenches in its extending direction.

2. The semiconductor device according to claim 1, wherein the MOS structure part includes:

a plurality of second semiconductor regions of the second conductivity type, each of the plurality of second semiconductor regions being provided between and in contact with the first semiconductor layer and the second semiconductor layer, between two adjacent first trenches among the plurality of first trenches, the plurality of second semiconductor regions having an impurity concentration that is higher than an impurity concentration of the second semiconductor layer, a plurality of third semiconductor regions of the second conductivity type, each of the plurality of third semiconductor regions being provided in the first semiconductor layer, at a position facing a corresponding one of the plurality of first trenches in a depth direction, and a plurality of connecting regions connecting the plurality of second semiconductor regions with the plurality of third semiconductor regions, wherein the plurality of temperature sensing portions include one or more of first temperature sensing portions and one or more of second temperature sensing portions, and one or more of the plurality of connecting regions has a corresponding one of the one or more of the second temperature sensing portions.

3. A method of manufacturing the semiconductor device according to claim 1, the method comprising:

forming the first semiconductor layer;

forming the second semiconductor layer;

selectively forming the first semiconductor region;

forming the first trenches the second trenches;

forming the gate electrodes via the gate insulating film;

forming the first polysilicon layers and the second polysilicon layers;

forming the interlayer insulating film;

forming the first electrode, the anode electrode, and the cathode electrode; and forming the second electrode.

4. A semiconductor device, comprising:

a MOS structure part that includes:

a semiconductor substrate of a first conductivity type, having a front surface and a back surface opposite to the front surface, a first semiconductor layer of the first conductivity type, provided at the front surface of the semiconductor substrate and having an impurity concentration that is lower than an impurity concentration of the semiconductor substrate, the first semiconductor layer having a first side and a second side that is opposite to the first side and faces the semiconductor substrate, a second semiconductor layer of a second conductivity type, provided at the first side of the first semiconductor layer and having a first side and a second side that is opposite to the first side and faces the semiconductor substrate, a plurality of first semiconductor regions of the first conductivity type, selectively provided in a surface layer of the first side of the second semiconductor layer, a plurality of first trenches each penetrating a corresponding one of the plurality of first semiconductor regions and the second semiconductor layer, and reaching the first semiconductor layer, a plurality of gate electrodes each provided in a corresponding one of the plurality of first trenches, via a gate insulating film, an interlayer insulating film provided on the plurality of gate electrodes, a first electrode provided at the first side of the second semiconductor layer and the first side of the plurality of first semiconductor regions, and a second electrode provided at the back surface of the semiconductor substrate; and a plurality of temperature sensing portions, each of which is provided in a region through which a main current flows in an ON state of the semiconductor device, and each of the plurality of temperature sensing portions includes:

the semiconductor substrate, the first semiconductor layer, a second trench provided in the second semiconductor layer, a first polysilicon layer of the first conductivity type and a second polysilicon layer of the second conductivity type, provided in the second trench via an insulating film, a cathode electrode electrically connected to the first polysilicon layer, and an anode electrode electrically connected to the second polysilicon layer, wherein the plurality of temperature sensing portions has a cathode electrode pad electrically connected to the cathode electrode of each of the plurality of temperature sensing portions, and the anode electrode of each of the plurality of temperature sensing portions is connected to a corresponding one of the plurality of first electrodes.

5. A semiconductor device, comprising:

a MOS structure part that includes:
- a semiconductor substrate of a first conductivity type, having a front surface and a back surface opposite to the front surface,
- a first semiconductor layer of the first conductivity type, provided at the front surface of the semiconductor substrate and having an impurity concentration that is lower than an impurity concentration of the semiconductor substrate, the first semiconductor layer having a first side and a second side that is opposite to the first side and faces the semiconductor substrate,
- a second semiconductor layer of a second conductivity type, provided at the first side of the first semiconductor layer and having a first side and a second side that is opposite to the first side and faces the semiconductor substrate,
- a plurality of first semiconductor regions of the first conductivity type, selectively provided in a surface layer of the first side of the second semiconductor layer,
- a plurality of first trenches each penetrating a corresponding one of the plurality of first semiconductor regions and the second semiconductor layer, and reaching the first semiconductor layer,
- a plurality of gate electrodes each provided in a corresponding one of the plurality of first trenches, via a gate insulating film,
- an interlayer insulating film provided on the plurality of gate electrodes,
- a first electrode provided at the first side of the second semiconductor layer and the first side of the plurality of first semiconductor regions, and
- a second electrode provided at the back surface of the semiconductor substrate; and a plurality of temperature sensing portions, each of which is provided in a region through which a main current flows in an ON state of the semiconductor device, and each of the plurality of temperature sensing portions includes:
- the semiconductor substrate,
- the first semiconductor layer,
- a second trench provided in the second semiconductor layer,
- a first polysilicon layer of the first conductivity type and a second polysilicon layer of the second conductivity type, provided in the second trench via an insulating film,
- a cathode electrode electrically connected to the first polysilicon layer, and an anode electrode electrically connected to the second polysilicon layer, wherein the plurality of temperature sensing portions has:
- a cathode electrode pad electrically connected to the cathode electrode of each of the plurality of temperature sensing portions, and
- an anode electrode pad electrically connected to the anode electrode of each of the plurality of temperature sensing portions.

* * * * *